United States Patent
Crawford et al.

(10) Patent No.: US 7,960,288 B2
(45) Date of Patent: *Jun. 14, 2011

(54) PHOTORESIST TRIMMING PROCESS

(75) Inventors: Shaun Crawford, Jericho, VT (US); Cuc K. Huynh, Jericho, VT (US); A. Gary Reid, Burlington, VT (US); Adam C. Smith, Colchester, VT (US); Thomas M. Wagner, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 424 days.
This patent is subject to a terminal disclaimer.

(21) Appl. No.: 11/869,373

(22) Filed: Oct. 9, 2007

(65) Prior Publication Data
US 2008/0032214 A1      Feb. 7, 2008

Related U.S. Application Data

(62) Division of application No. 10/711,043, filed on Aug. 19, 2004, now Pat. No. 7,304,000.

(51) Int. Cl.
*H01L 21/302* (2006.01)

(52) U.S. Cl. .......... 438/725; 257/E21.255; 257/E21.259

(58) Field of Classification Search .......... 438/689, 438/706–707, 710, 717, 725; 430/299, 313; 257/E21.254, E21.259
See application file for complete search history.

(56) References Cited

U.S. PATENT DOCUMENTS

| | | | |
|---|---|---|---|
| 6,057,247 A | 5/2000 | Imai et al. | |
| 6,242,165 B1 * | 6/2001 | Vaartstra | 430/329 |
| 6,291,360 B1 * | 9/2001 | Moon | 438/725 |
| 6,500,605 B1 | 12/2002 | Mullee et al. | |
| 6,509,141 B2 | 1/2003 | Mullee | |
| 6,537,916 B2 | 3/2003 | Mullee et al. | |
| 6,613,157 B2 | 9/2003 | DeYoung et al. | |
| 6,716,570 B2 | 4/2004 | Nagarajan et al. | |
| 7,304,000 B2 * | 12/2007 | Crawford et al. | 438/725 |
| 2003/0075524 A1 | 4/2003 | Kawaguchi et al. | |
| 2004/0241579 A1 * | 12/2004 | Hamada et al. | 430/270.1 |
| 2005/0045799 A1 | 3/2005 | Deng et al. | |

FOREIGN PATENT DOCUMENTS

| | | |
|---|---|---|
| JP | 62-40729 | 2/1987 |
| JP | 63216346 | 9/1988 |
| JP | 63216346 A * | 9/1988 |

OTHER PUBLICATIONS

Office Action in U.S. Appl. No. 11/862,255, dated Sep. 3, 2009.
Office Action dated Feb. 23, 2010 in U.S. Appl. No. 11/862,255.

* cited by examiner

*Primary Examiner* — Brook Kebede
(74) *Attorney, Agent, or Firm* — Richard Kotulak; Roberts Mlotkowski Safran & Cole, P.C.

(57) ABSTRACT

A photoresist trimming gas compound is provided which will selectively remove a resist foot or scum from the lower portions of sidewalls of a photoresist. Additionally, the trimmer compound hardens or toughens an upper surface of the photoresist thereby strengthening the photoresist. The trimmer compound includes $O_2$ and at least one other gaseous oxide and is typically utilized in a dry etching process after a trench has been formed in a photoresist. The other oxide gases, in addition to the $O_2$ may include $CO_2$, $SO_2$ and $NO_2$.

7 Claims, 4 Drawing Sheets

PHOTORESIST TRIMMING PROCESS

CROSS REFERENCE TO RELATED APPLICATIONS

This application is a divisional of U.S. patent application Ser. No. 10/711,043, filed Aug. 19, 2004 now U.S. Pat. No. 7,304,000, the disclosure of which is expressly incorporated by reference herein in its entirety.

BACKGROUND OF INVENTION

1. Field of the Invention

The invention relates to a photoresist trimming process, and more particularly to a photoresist trimming process incorporating oxide gases into the etchant.

2. Background Description

In photolithographic mask fabrication, it is typically preferable for the sidewalls of the mask to be as perpendicular to a reference surface as possible. Typically, the sidewalls are preferred to be perpendicular to the base surface of the substrate. However, an unwanted resist or mask foot or scum may form a generally sloping structure which is narrow at its top, and broadens towards its bottom. That is, the mask foot is an extension of mask material extending from a mask sidewall into the opening in the mask bounded by the sidewall.

A mask foot may typically protrude about 20 nm from a sidewall of a mask about 3000 Å thick. Where the sidewall bounds a trench in the mask on the order of about 500 nm, a 20 nm foot represents about a 10% error when the underlying layer is imaged using the mask, when considering that the opposite sidewall will have a similar mask foot. Such large mask errors complicate the design process and reduce manufacture yield.

Because the resist foot tends to be copied into any structure etched by the etchant, the foot typically forms a defect on the image photoresist. This defect is then replicated when the lower substrate is etched using the photoresist mask to guide the etching of the substrate.

Accordingly, methods have been developed in an attempt to remove and/or reduce the size of the resist foot. One method to reduce the size of the resist foot includes using a higher power level of radiation when exposing the photoresist, and/or using an etchant having higher selectivity to etch photoresist.

However, exposing the resist at higher power levels, and/or etching the resist with a more selective etchant typically damages that portion of the photoresist mask which is desired to be left intact. Such damage typically includes weakening the photoresist mask and thus reducing the ability of the photoresist mask to form precision or critical edges.

SUMMARY OF INVENTION

In a first aspect of the invention, a method of photoresist trimming includes the steps of forming a resist foot in a trench, and removing the resist foot found in the trench during a trimming process.

In another aspect of the invention, a method of forming an imaging mask includes the steps of arranging an opaque layer on a transparent substrate, and arranging a mask material on the opaque layer. The method also includes imaging the mask with a prescribed pattern, and trimming an etched mask with a trimming gas comprising $O_2$ and at least one other oxide gas.

In another aspect of the invention, a trim gas for etching a mask foot formed at a base of a sidewall pattern includes $O_2$ and at least one other oxide gas comprising at least any one of $CO_2$, $SO_2$, and $NO_2$.

DETAILED DESCRIPTION

Figure 1:
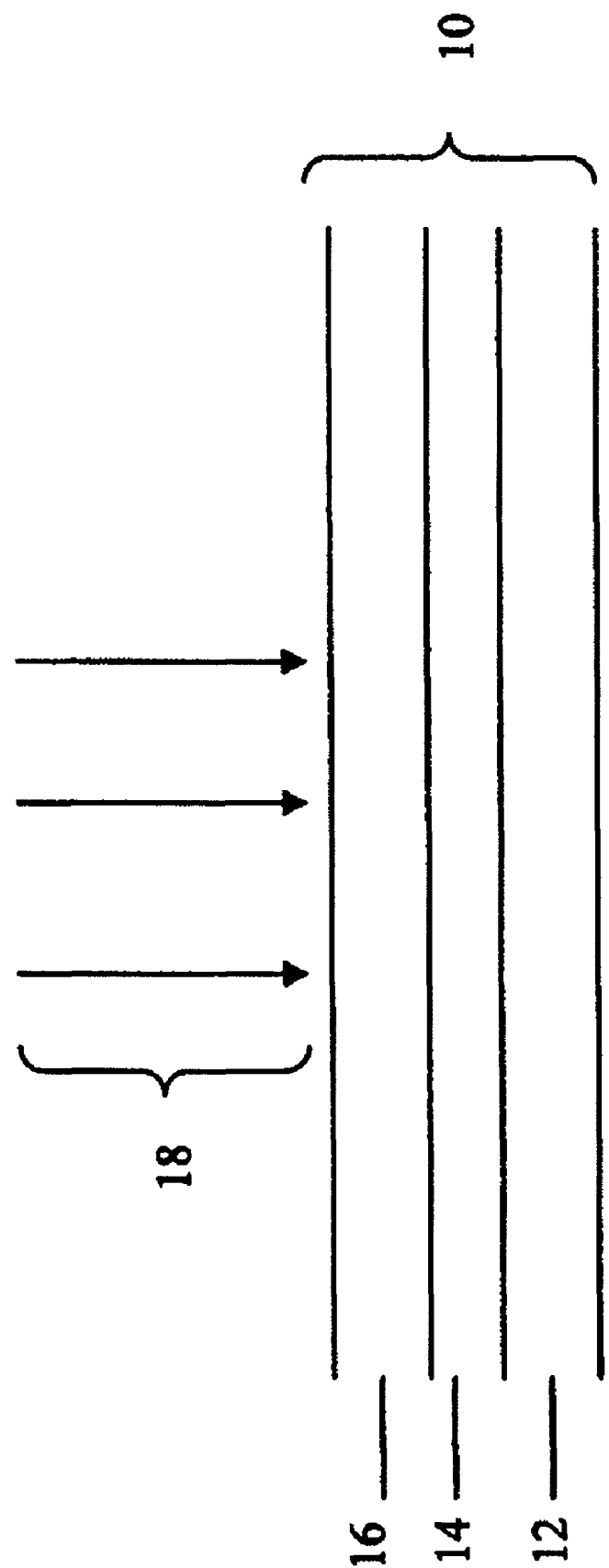
FIG. 1 is an illustration of a structure to be imaged.

Embodiments of the invention are directed to improving the accuracy of mask or resist imaging and sidewall formation by formulating a trimming or descum etchant which selectively etches a resist foot while polymerizing the upper surface of the resist mask. Accordingly, embodiments of the invention are configured to form a more accurate mask by creating straighter mask sidewalls by selectively removing an unwanted resist foot at the base of a resist sidewall without significantly thinning the resist mask. Referring to FIG. 1, an example of a structure to be etched 10 is shown. The structure 10 includes a substrate of a transparent material 12. On top of the transparent material 12 is an opaque material 14 and on top of the opaque material 14 is a photoresist 16. Examples of such a structure include a mask which will be imaged and used for further lithographic imaging. Such a mask typically has a layer of quartz as the transparent substrate onto which a layer of chromium is formed as the opaque layer. The layer of chromium will typically have a photoresist deposited thereon.

The resist is typically an organic resist which is usually spin-coated onto the opaque material 12 in preparation for photolithographic imaging. An example of an organic resist suitable to be used with embodiments of the invention include a chemical amplified resist (CAR). After the structure 10 is formed, it is then exposed 18 using a photolithographic imaging device. Typically the photolithographic imaging device is an E-beam writer. However, other imaging devices may be used in accordance with the principles of the invention.

Figure 2:
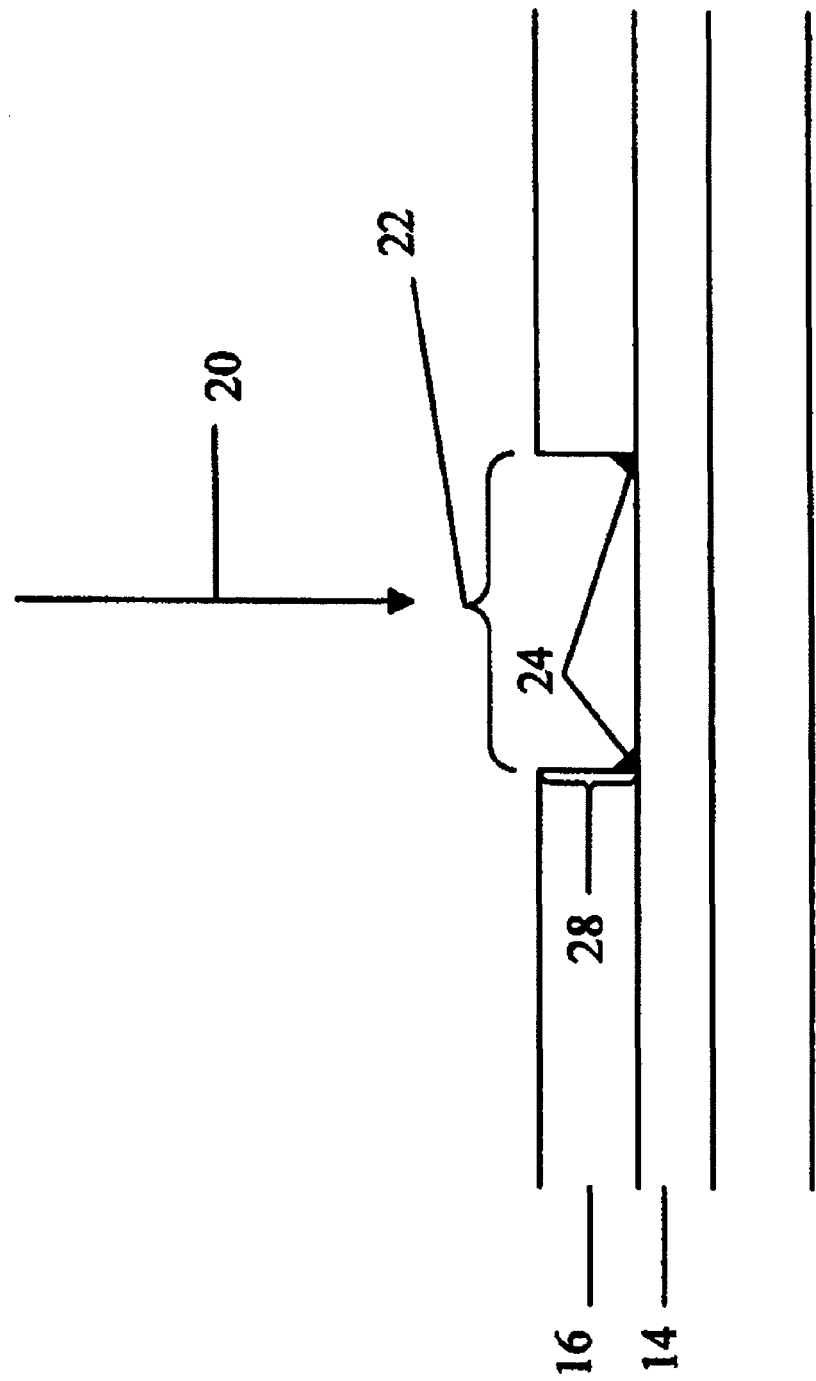
FIG. 2 is an illustration of a trench with a resist foot in a mask.

Referring to FIG. 2, a developer 20 is applied to the photoresist 16 to form a trench 22 in the resist. The developer 20 can include any of the solvents well known in the art for developing a photoresist.

The developer 20 will form a trench 22 having a sidewall 28 in the photoresist 16 according to how the photoresist 16 was exposed to radiation. Accordingly, the trench 22 is formed in the region of the photoresist 16 which was exposed by the radiation 18. Consequently, the trench 22 is formed in a prescribed pattern where the prescribed pattern should be accurately represented by the trench 22. The developing of the trench 22 stops at the opaque layer 14. Thus, the opaque layer 14 is exposed along the bottom of the trench 22.

The developer 20, in addition to forming a trench 22 in the photoresist 16, will leave behind a mask or resist foot 24 at the lower section of each photoresist sidewall 28. Thus, the sidewall 28 will have an irregular and unwanted extension protruding from its lower section which deviates from the desired image to be formed in the photoresist 16.

More specifically, the resist foot 24 typically has an irregular sloping shape which generally starts about the middle of the sidewall 28 of the trench 22. The resist foot 24 thus forms a sloping shoulder from about the middle of the sidewall 28 protruding into the trench 22 at the bottom of the sidewall 28. Accordingly, even though the trench 22 has a prescribed width and is developed to that width near the top of the trench 22, the processes of the imaging and developing steps will leave residual mask material near the bottom of the trench 22 which forms the mask foot 24 and thus will partially mask a portion of the opaque layer 14 which was otherwise intended to be removed in a subsequent etching process.

Figure 3:
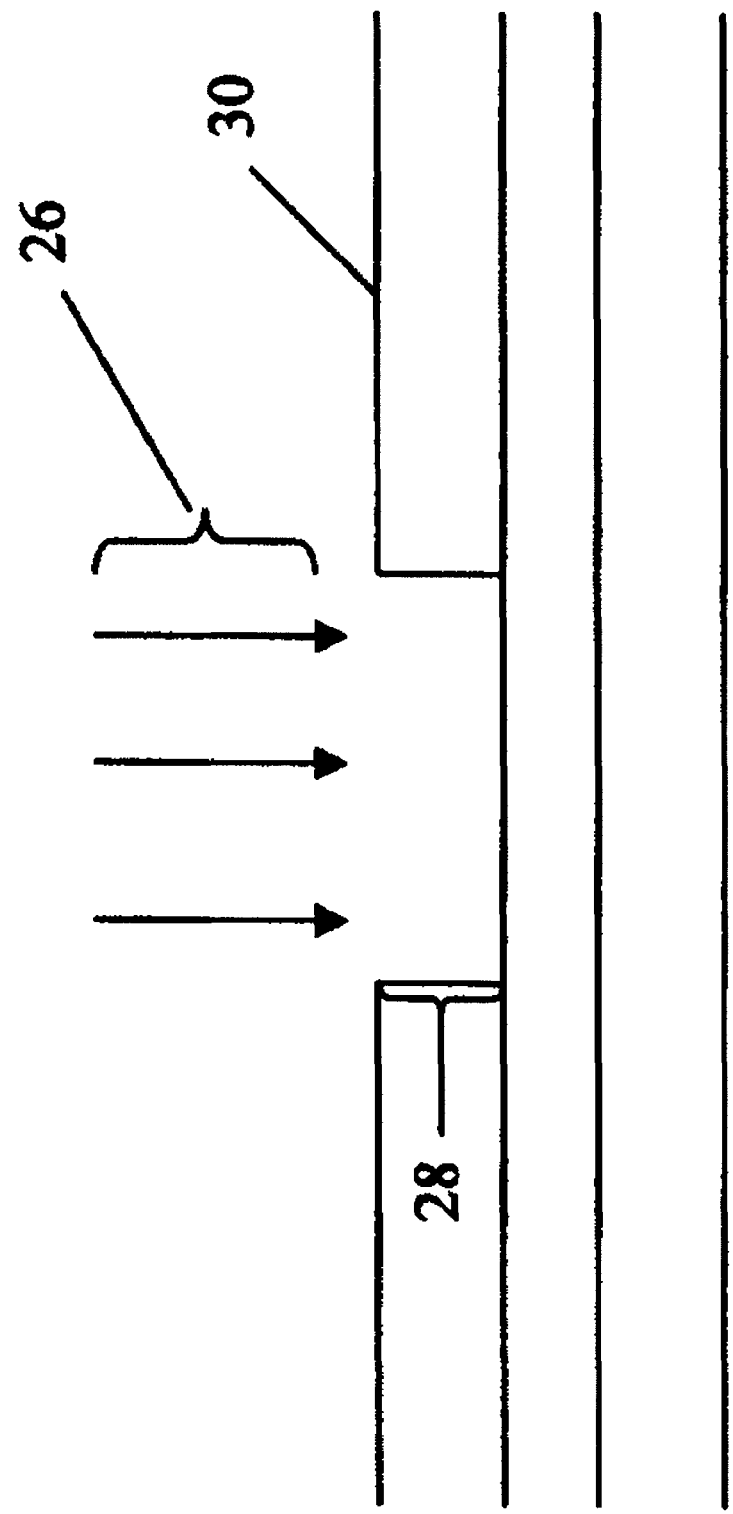
FIG. 3 is an illustration of a trimming process in accordance with an embodiment of the invention.

Referring to FIG. 3, a trim step includes trimming away the resist foot 24 using a combination of $O_2$ and an oxide gas. The oxide gases may include, for example, $CO_2$, $SO_2$, or $NO_2$, as well as other oxide gases. Together, the $O_2$ and the other oxide gases form a trimming gas 26. The $O_2$ and other oxide gas may form the trimming gas 26 in a wide range of mixing ratios ranging from about 1 to 50, to about 1 to 1 to about 50:1. In one embodiment, the mixture of gases comprising $O_2$ and at least one other gaseous oxide is in a ratio of ranging from 1:10 to about 10:1.

In one embodiment, $O_2$, and $CO_2$ may be used in a ratio of about 1:3. In this one specific embodiment, the $CO_2$ is a heavier gas and thus a more vigorous ion bombardment is provided during the descum process which removes the resist footing and thus results in a straighter sidewall. The $CO_2$ is selected because it forms a carbon barrier layer, which is a polymerization process, on the top surface of the resist. This results in a minimum resist thickness loss, allowing ion bombardment to take place on the resist image sidewalls.

Additionally, the trimming gas 26 may include more than just one oxide gas and thus may include $O_2$, and $CO_2$, as well as $SO_2$, and even $NO_2$, etc. in various mixing ratios. For example, the trimming gas 26 may be formed substantially of $O_2$ and $CO_2$ with little, if any other constituents. Additionally, the trimming as may be formed from a combination of $O_2$, $CO_2$, and $SO_2$.

The trimming gas 26 is typically applied to the photoresist 16 through a dry etching process. For example, the trimming gas 26 may be applied to the photoresist 16 to remove the resist foot 24 through a plasma etching process. When the trimming gas 26 is used in a plasma etching process, the trimming gas 26 is typically held at a pressure of about 99 milliTorr (mT). However, a wide range of other pressures may be used ranging from about 1 mT to about 1,000 mT. Additionally, narrower pressure ranges, such as 1 mT to 100 mT, may also be used. Finally even narrower pressure ranges such as 95 mT to 105 mT, may be used. Further parameters applied in the plasma etching process are typical of other plasma etching processes well known in the art.

Mixing the trimming gas 26 typically occurs in the plasma during a plasma etching process. Thus the $O_2$ and other gaseous oxides may be introduced directly into an etching chamber where they mix together just prior and during the etching process. Alternatively, the gases may be premixed just prior to injecting into the etching chamber.

When the trimming gas 26 is applied to remove the resist foot 24 through a plasma etching process, the oxide and the other gaseous oxides interact with the resist material and selectively reduce or remove the resist foot 24, and additionally harden or strengthen an upper surface of the mask 16 forming a hardened layer 30 of the photoresist 16. The hardened layer 30 may include polymerizing an upper layer of the photoresist 16 and/or forming a carbon buildup in the hardened layer 30 of the photoresist 16.

Accordingly, the trimming process or trimming gas 26 has the advantages of reducing or removing a resist foot 24 from the sidewall 28 of a trench 22 in a photoresist 16. Consequently, the sidewall 28 of the trench 22 is etched and trimmed to be substantially perpendicular to an upper surface or a lower surface of the photoresist 16 as well as being substantially perpendicular to an upper surface of the underlying opaque layer 14.

Although the examples of FIGS. 1 through 3 show the trimming process being applied to a structure including a transparent layer underneath an opaque layer with the photoresist thereupon, the trimming process may be utilized in virtually any situation where a trench having a resist foot needs to have a straight sidewall, and the trimming gases will not harm other material in the structure being trimmed.

Table 1 shows examples of results from trimming processes. TABLE-US-00001

TABLE 1

| Lot # | Process Description | CD SEM Post Etch Cr (X, Y) (3 Sigma) nm | DUV KMS Post Etch Cr (X, Y) (3 Sigma) nm |
|---|---|---|---|
| J7D23000JV | $O_2$ low pressure descum | 17, 18 | 17, 16 |
| J7D23001JV | $O_2/CO_2$ high pressure descum | 14, 14 | 15, 15 |
| J7D23003JV | $O_2$ high pressure descum | 17, 18 | 17, 17 |

Column 1 labeled "Lot #" indicates a particular wafer which was subjected to the trimming process. Column 2 labeled "Process Description" indicates whether the trim or descum step was high pressure or low pressure, and whether a gaseous oxide was included to trim. For example, lot J7D23001JV was performed with $O_2/CO_2$ high pressure descum.

Column 3 labeled "CD SEM Post Etch Cr (X,Y) (3 sigma)" indicates a deviation of the sidewall in nm of a Cr mask formed when using a photoresist trimmed in accordance with the invention, as determined by a scanning electron microscope measurement. Column 4 labeled "DUV KMS Post Etch Cr (X,Y) (3 sigma)" indicates a deviation of the sidewall in nm of a Cr mask formed when using a photoresist trimmed in accordance with the invention as determined by an optical interferometery measurement. Thus, Columns 3 and 4 show that a chrome mask formed by a photoresist mask trimmed using a gaseous oxide trimming gas has a repeatability of about 14 nm and 15 nm, respectively, as determined by two different measurement techniques. This has a substantial improvement over non-oxide gas trims at 16-18 nm (J7D23000JV and J7D23003JV), as determined by the two measurement techniques.

Figure 4:
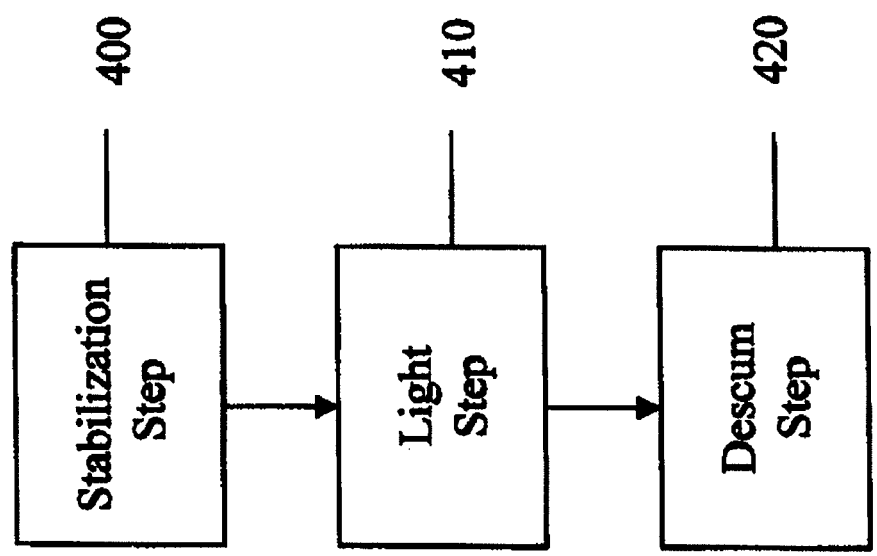
FIG. 4 shows steps implementing the trimming process of the invention.

FIG. 4 shows steps of one embodiment, implementing the trimming process of the invention. At step 400, a stabilization step is performed. The stabilization step, in one embodiment, includes (i) time=50 seconds, (ii) pressure=99 mT, (iii) Cl=0.1 sccm, $O_2$=45 sccm and $CO_2$=50 sccm. At step 410, a light step is performed. The light step may include, for example, (i) time=7 seconds, (ii) pressure=99 mT, (iii) RF power=125 watts and (iv) Cl=0.1 sccm, $O_2$=45 sccm and $CO_2$=50 sccm. Next, at step 420, a descum step in accordance with the invention is performed. In one example, this step may include (i) time=process seconds, (ii) pressure=99 mT, (iii) RF power=125 watts and (iv) Cl=0.1 sccm, $O_2$=18 sccm and $CO_2$=50 sccm.

While the invention has been described in terms of exemplary embodiments, those skilled in the art will recognize that the invention can be practiced with modifications and in the spirit and scope of the appended claims.

What is claimed is:

1. A method of forming an imaging mask, comprising the steps of:
   arranging an opaque layer on a transparent substrate;
   arranging a mask material on the opaque layer;
   imaging the mask with a prescribed pattern;
   forming a trimming gas by mixing $O_2$ and at least one other oxide gas at a pressure ranging from about 1 mT to 1000 mT, wherein the at least one other oxide gas comprises at least one of $CO_2$ and $SO_2$;
   trimming an etched mask with the trimming gas comprising $O_2$ and at least one other oxide gas; and
   performing one of: (i) polymerizing an upper surface of the mask, (ii) providing a barrier on the upper surface of the mask derived from an oxide gas, and (iii) arranging a carbon barrier on the upper surface of the mask.

2. The method of claim 1, wherein the forming the trimming gas comprises mixing any of at least $CO_2$, $SO_2$ and $NO_2$ with $O_2$ in a ratio ranging from about 1:10 to about 10:1.

3. The method of claim 1, wherein the imaging step includes the formation of a mask foot at a based of the prescribed pattern and the trimming step includes removal of the mask foot to form substantially perpendicular sidewalls of the prescribed pattern with respect to a surface thereof.

4. The method of claim 1, wherein the forming and trimming comprise a plasma etching process.

5. A method of forming an imaging mask, comprising the steps of:
   arranging an opaque layer on a transparent substrate;
   arranging a mask material on the opaque layer;
   imaging the mask with a prescribed pattern;
   forming a trimming gas by mixing $O_2$ and at least one other oxide gas at a pressure ranging from about 1 mT to 1000 mT, wherein the at least one other oxide gas comprises at least one of $CO_2$ and $SO_2$; and
   trimming an etched mask with the trimming gas comprising $O_2$ and at least one other oxide gas,
   wherein the $O_2$ and the at least one other oxide gas are configured to one of: form a carbon barrier on an upper surface of the mask, and polymerize the upper surface of the mask.

6. A method of forming an imaging mask, comprising the steps of:
   arranging an opaque layer on a transparent substrate;
   arranging a mask material on the opaque layer;
   imaging the mask with a prescribed pattern;
   forming a trimming gas by mixing $O_2$ and at least one other oxide gas at a pressure ranging from about 1 mT to 1000 mT;
   trimming an etched mask with the trimming gas comprising $O_2$ and at least one other oxide gas; and
   performing one of: (i) polymerizing an upper surface of the mask, (ii) providing a barrier on the upper surface of the mask derived from an oxide gas, and (iii) arranging a carbon barrier on the upper surface of the mask.

7. A method of forming an imaging mask, comprising the steps of:
   arranging an opaque layer on a transparent substrate;
   arranging a mask material on the opaque layer;
   imaging the mask with a prescribed pattern;
   forming a trimming gas by mixing $O_2$ and at least one other oxide gas at a pressure ranging from about 1 mT to 1000 mT; and
   trimming an etched mask with the trimming gas comprising $O_2$ and at least one other oxide gas;
   wherein the $O_2$ and the at least one other oxide gas are configured to one of: form a carbon barrier on an upper surface of the mask, and polymerize the upper surface of the mask.

* * * * *